Dec. 17, 1963

SABURO IWATA

SEMI-CONDUCTOR DEVICE

Filed Dec. 9, 1960

3,114,866

Inventor
Saburo Iwata by Hill, Sherman, Meroni, Gross & Simpson
Attys.

United States Patent Office 3,114,866
Patented Dec. 17, 1963

3,114,866

SEMI-CONDUCTOR DEVICE

Saburo Iwata, Tokyo, Japan, assignor to Sony Corporation, Shinagawa-ku, Tokyo, Japan, a corporation of Japan Filed Dec. 9, 1960, Ser. No. 74,906
Claims priority, application Japan Dec. 16, 1959
2 Claims. (Cl. 317—234)

This invention relates to a semiconductor device and more particularly to a tunnel diode assembly.

One object of this invention is to provide a semiconductor device such as a tunnel diode having two electrodes which can be simply assembled and mounted onto conductor plates.

Another object of this invention is to provide a tunnel diode assembly which is simple in construction and can be made by an easy etching operation.

Further objects, features and advantages of this invention will be more apparent from the following description taken in connection with the accompanying drawing in which.

Figure 1:
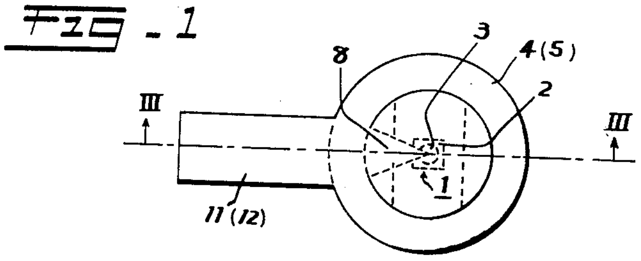
FIGURE 1 is an enlarged plan view of a semiconductor device according to this invention.
Figure 2:
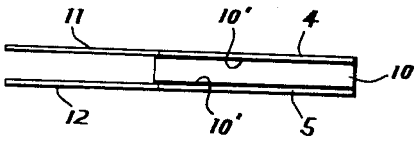
FIGURE 2 is a side view of the device shown in FIGURE 1.
Figure 3:
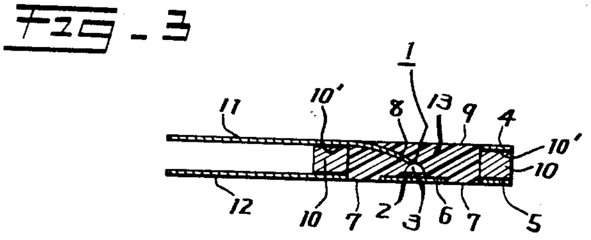
FIGURE 3 is a sectional view of the semiconductor device shown in FIGURE 1 along the line III—III.

Referring to the drawing, 1 represents a semiconductor element such for example as a tunnel diode. 2 denotes a wafer which constitutes one electrode of the semiconductor element, which wafer is, for exampile, a germanium wafer when the semiconductor is made of germanium. 3 is a dot of an acceptor impurity which constitutes the other electrode, which dot is, for example, an indium dot when the other electrode is made of indium.

In accordance with this invention, two conductor plates 4 and 5 are arranged oppositely and in parallel and apertures 7 are formed on the midpart of one conductor plate 5, while leaving a bridge portion 6 between the apertures 7. Another aperture 9 is formed on the midpart of the other conductor plate 4, leaving a tongue 8 which is projected to the center of the aperture 9 from the inner periphery thereof. The conductor plates 4 and 5 are electrically insulated from each other by means of an insulator ring 10 such for example as a ceramic ring plate. The wafer 2 is soldered to the bridge portion 6 of the conductor plate 5 in the center space surrounded by the insulator ring 10 and the free end of the tongue 8 projecting from the other conductor plate 4 is turned towards the dot 3 and connected in ohmic contact therewith.

The conductor plates 4 and 5 may preferably be made of a metal such as nickel, nickel-iron alloy, cobalt or the like.

Preferably, the annular conductor plates 4 and 5 are provided with integral extension legs 11 and 12 for connecting the plates 4 and 5 to other circuits. In some cases, however, the legs 11 and 12 are dispensed with and the conductor plates 4 and 5 can be directly soldered to other circuits.

In the case where a ceramic plate is used as the insulator ring 10, it is difficult to mount the ceramic plate directly to the conductor plates 4 and 5. To improve the bond between the two, I may provide metal layers 10' on both contact surfaces of the insulator ring 10 by means of a metalizing technique such as vacuum deposition, flame spraying, or the like and thereafter the ceramic plate is soldered to the conductor plates 4 and 5 in the presence of the metal layers.

To this end, a porcelain plate, such as an alumina-forsterite plate, which is metalizable will preferably be employed as the ceramic plate. On the free end of the tongue 8 will also be formed an indium-plated layer to which the dot 3 is welded. The semiconductor element 1 thus assembled can be sealed by an insulating resin 13, such as an epoxy resin, a melamine resin, or a phenolic resin if desired.

The construction according to this invention has the advantage that an etchant which is used for electrolytic polishing, acid etching or the like will easily flow through apertures 7 and 9 in the process of making the semiconductor device, thereby facilitating the control of the etchant flow.

This invention has also an additional advantage that mass production of such a semiconductor device can be attained by the simple assembly in which the dot 3 is connected to the conductor plate 4 by means of the tongue 8 projected therefrom without using any other lead wire.

It will be understood that many modifications and variations may be effected without departing from the scope of the novel concepts of this invention.

What is claimed is:

1. A semiconductor device comprising a semiconductor element having a semiconductor wafer and an impurity dot bonded thereon, a conductor plate having an aperture on the midpart thereof and a bridge portion through said aperture, said semiconductor wafer being secured to said bridge portion, a second conductor plate having an aperture on the midpart thereof and a tongue which projects to the center of said aperture from the periphery thereof, an insulator ring separating said conductor plates, the free end of said tongue being turned towards said dot and connected therewith, and a body of resin disposed about said semiconductor element and completely enclosing the end of said tongue.

2. A semiconductor device comprising a semiconductor element having a semiconductor wafer and an impurity dot diffused thereon, an annular conductor plate which is provided with an aperture on the midpart thereof and a bridge portion through said aperture, said semiconductor wafer being soldered on said bridge portion, another conductor plate which is provided with an aperture in a midpart thereof and a tongue which projects to the center of said aperture from the periphery thereof, an insulator ring secured to said conductor plates and holding said plates in spaced parallel relationship, the free end of said tongue being turned towards said dot and connected therewith, legs integrally formed with said annular conductor plates, and a resin disposed about said semiconductor element and enclosing the end of said tongue for sealing said semiconductor element.

References Cited in the file of this patent

UNITED STATES PATENTS

| | | |
|---|---|---|
| 2,495,353 | Smith | Jan. 24, 1950 |
| 2,745,044 | Lingel | May 8, 1956 |
| 2,876,401 | Fuller | Mar. 3, 1959 |
| 2,894,183 | Fermanian | July 7, 1959 |
| 2,899,610 | Van Amstel | Aug. 11, 1959 |
| 3,001,113 | Mueller | Sept. 19, 1961 |